(12) United States Patent
Suzuki

(10) Patent No.: US 6,416,913 B1
(45) Date of Patent: Jul. 9, 2002

(54) SCANNING EXPOSURE METHOD ACCOUNTING FOR THERMAL TRANSFORMATION OF MASK

(75) Inventor: Kousuke Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/721,716

(22) Filed: Nov. 27, 2000

Related U.S. Application Data

(63) Continuation of application No. 09/223,278, filed on Dec. 30, 1998, now abandoned, which is a continuation of application No. 08/761,830, filed on Dec. 6, 1996, now abandoned.

(30) Foreign Application Priority Data

Dec. 11, 1995 (JP) ............................................. 7-321362

(51) Int. Cl.$^7$ ................................................. G03F 9/00
(52) U.S. Cl. ....................................................... 430/30
(58) Field of Search ............................................ 430/30

(56) References Cited

U.S. PATENT DOCUMENTS

| | | | |
|---|---|---|---|
| 5,591,958 A | | 1/1997 | Nishi et al. ................. 250/205 |
| 5,661,546 A | * | 8/1997 | Taniguchi ..................... 355/53 |
| 5,661,548 A | * | 8/1997 | Imai ............................. 355/55 |
| 5,721,608 A | | 2/1998 | Taniguchi ..................... 355/53 |

* cited by examiner

Primary Examiner—Christopher G. Young
(74) Attorney, Agent, or Firm—Oliff & Berridge PLC

(57) ABSTRACT

Points for calculation are set at uniform intervals on an ideal lattice set over a pattern area on a reticle. An amount of light incident on a slit-shaped illumination area on a lens is measured with an integrator sensor. An amount of heat absorbed by the reticle according to the position in a scanning direction is calculated on the basis of a pattern presence ratio on the reticle, and an amount of thermal expansion at each point for calculation is calculated on the basis of the calculated amount of heat absorbed. A change in the magnification of a projected image is obtained from the calculated amount of thermal expansion. At the same time, a change in the projection magnification caused by a projection optical system itself is also calculated according to the position in the scanning direction of the reticle. The projection magnification of the projection optical system is corrected through a magnification correction mechanism so as to cancel both the magnification changes thus calculated.

39 Claims, 5 Drawing Sheets

SCANNING EXPOSURE METHOD ACCOUNTING FOR THERMAL TRANSFORMATION OF MASK

This application is a continuation of prior application Ser. No. 09/223,278 filed Dec. 30, 1998; now abandoned which is a Continuation of Ser. No. 08/761,830 filed Dec. 6, 1996 now abandoned.

BACKGROUND OF THE INVENTION

The present invention relates to an exposure apparatus and method used for transferring a pattern on a mask onto a photosensitive substrate through a projection optical system in photolithography processes to produce, for example, semiconductor devices, liquid-crystal display devices, imaging devices (e.g. CCDs), or thin-film magnetic heads. More particularly, the present invention relates to a step-and-scan or other type of scanning exposure apparatus and scanning exposure method, in which exposure is carried out by synchronously scanning a mask and a photosensitive substrate relative to a projection optical system.

In photolithography processes for producing semiconductor devices or the like, stepper-type projection exposure apparatuses have mainly been used, in which a pattern on a reticle (or a photomask or the like) is transferred onto each shot area on a wafer (or a glass plate) by one-shot exposure through a projection optical system. Recently, however, attention has been paid to scanning exposure type projection exposure apparatuses, i.e. slit scan type and step-and-scan type projection exposure apparatuses, in which a reticle and a wafer are scanned relative to a projection optical system, thereby sequentially transferring a pattern on the reticle onto each shot area on the wafer, in order to comply with the demand that a pattern of a wider area should be exposed with the image-formation characteristics maintained at the desired level. It is possible according to the scanning exposure type of projection exposure apparatus to use approximately the largest diameter of the effective exposure field of the projection optical system by illuminating the reticle with slit-shaped illuminating light, by way of example. Moreover, by synchronously scanning the reticle and the wafer, the exposure field can be enlarged without being restricted by the optical system. Furthermore, because only a part of the effective exposure field of the projection optical system is used, the required accuracies for illuminance uniformity, distortion, etc. can be readily obtained.

Overlay accuracy is one of important performances of the above-described projection exposure apparatuses. More specifically, a semiconductor device, for example, is formed by stacking on a wafer a multiplicity of layers of different circuit patterns. Therefore, a circuit pattern drawn on a reticle must be precisely overlaid on a pattern already formed on each shot area on the wafer. One of the important factors influencing the overlay accuracy is the magnification error (distortion) of the projection optical system. There is a growing tendency for the size of patterns used in very-large-scale integrated circuits (VLSI) and so forth to shrink year by year. Accordingly, the demand for an improvement in the overlay accuracy on a wafer is also growing. Therefore, there is an extremely strong need to maintain the projection magnification at a predetermined value.

Incidentally, the projection magnification of the projection optical system fluctuates in the vicinity of a predetermined magnification in accordance with a slight temperature change in the system, a slight pressure variation or temperature change of atmospheric air in a clean room where the projection exposure apparatus is placed, and the irradiation history of the projection optical system irradiated with exposure light energy. Distortion may, for example, be produced by thermal expansion of the reticle. Therefore, some of the latest scanning exposure apparatuses have a magnification correction mechanism for finely adjusting the magnification of the projection optical system to realize a predetermined magnification. As specific examples of the magnification correction mechanism, the following mechanisms have already been proposed: a mechanism that changes the spacing between the reticle and the projection optical system; a mechanism that changes a predetermined lens spacing in the projection optical system; and a mechanism that adjusts the pressure in a predetermined gas chamber provided in the projection optical system.

Thus, various magnification correction mechanisms have heretofore been proposed to cope with a temperature change in the projection optical system of a projection exposure apparatus and other variations in environmental conditions. However, the conventional correction mechanisms are adapted to correct the distortion or magnification over the whole exposure area by calculating an amount of thermal expansion of the reticle or an amount of change in the distortion of the projection optical system. This is the same in scanning exposure type projection exposure apparatuses. That is, the coefficient of thermal expansion of the reticle has heretofore been regarded as uniform over the whole reticle, and the conventional practice is to correct the magnification of a projected image in a slit-shaped exposure area.

In the case of the scanning exposure type, however, the coefficient of thermal expansion of the reticle is not uniform over the whole pattern area in practice but varies according to the position in the scanning direction. Therefore, as the position of the reticle changes during scanning exposure, the distortion or magnification of the projected image in the slit-shaped exposure area on the wafer changes, and as a result, the overlay accuracy is degraded.

In view of the above-described circumstances, an object of the present invention is to provide a scanning exposure apparatus and scanning exposure method which provide superior image-formation characteristics irrespective of the position of the reticle in the scanning direction.

SUMMARY OF THE INVENTION

The present invention provides a scanning exposure method including the step of synchronously scanning a mask and a substrate relative to illuminating light, thereby transferring an image of a pattern on the mask onto the substrate through a projection optical system by scanning exposure, and the step of changing, during the scanning exposure, an image-formation characteristic of the projection optical system according to a scanning position of the mask.

The image-formation characteristic of the projection optical system may include at least one of magnification and distortion.

The change of the image-formation characteristic may be effected by moving a lens element of the projection optical system for projecting the image of the pattern on the mask onto the substrate.

The change of the image-formation characteristic may be effected by adjusting a refractive index in an enclosed space provided in the projection optical system for projecting the image of the pattern on the mask onto the substrate.

The image-formation characteristic of the projection optical system may be changed by taking into consideration thermal expansion of the mask, the thermal expansion varying in amount according to the position on the mask.

The scanning exposure method may further include the step of obtaining amounts of thermal expansion at a plurality of positions on the mask on the basis of an amount of light incident on the mask, so that the image-formation characteristic of the projection optical system is changed on the basis of the amounts of thermal expansion obtained.

The amounts of thermal expansion at a plurality of positions on the mask may be obtained on the basis of a pattern presence ratio on the mask.

The scanning exposure method may further include the step of obtaining an amount of change in image-formation condition of the pattern image due to thermal expansion of the mask in correspondence to each scanning position of the mask.

The scanning exposure method may further include the step of obtaining an amount of change in the image-formation characteristic of the projection optical system on the basis of an amount of light entering the projection optical system, so that the projection optical system is adjusted by taking into consideration the obtained amount of change in the image-formation characteristic of the projection optical system.

In addition, the present invention provides a scanning exposure method including the step of synchronously scanning a mask and a substrate relative to illuminating light, thereby transferring an image of a pattern on the mask onto the substrate by scanning exposure, and the step of changing, during the scanning exposure, a position of the mask in a direction of an optical axis of the illuminating light or a tilt of the mask relative to the optical axis according to a scanning position of the mask, thereby changing an image-formation condition of the pattern image.

In addition, the present invention provides a scanning exposure apparatus including a light source, and a scanning system for synchronously scanning a mask and a substrate relative to illuminating light from the light source. The apparatus further includes a projection optical system for projecting an image of a pattern on the mask onto the substrate, and a control system for changing, during scanning exposure, an image-formation characteristic of the projection optical system according to a scanning position of the mask.

The scanning exposure apparatus may further include an optical sensor for detecting an amount of light incident on the mask, and a system for calculating an amount of thermal expansion of the mask on the basis of the detected amount of light incident on the mask.

The control system may move a lens element of the projection optical system to change the image-formation characteristic of the projection optical system.

The control system may change a refractive index of a gas in a space provided in the projection optical system to change the image-formation characteristic of the projection optical system.

DETAILED DESCRIPTION OF PREFERRED EMBODIMENTS

One embodiment of the scanning exposure apparatus according to the present invention will be described below with reference to the accompanying drawings. In this embodiment, the present invention is applied to a step-and-scan type projection exposure apparatus, in which a reticle and a wafer are synchronously scanned relative to a projection optical system, thereby sequentially transferring a pattern on the reticle onto each shot area on the wafer.

Figure 1:
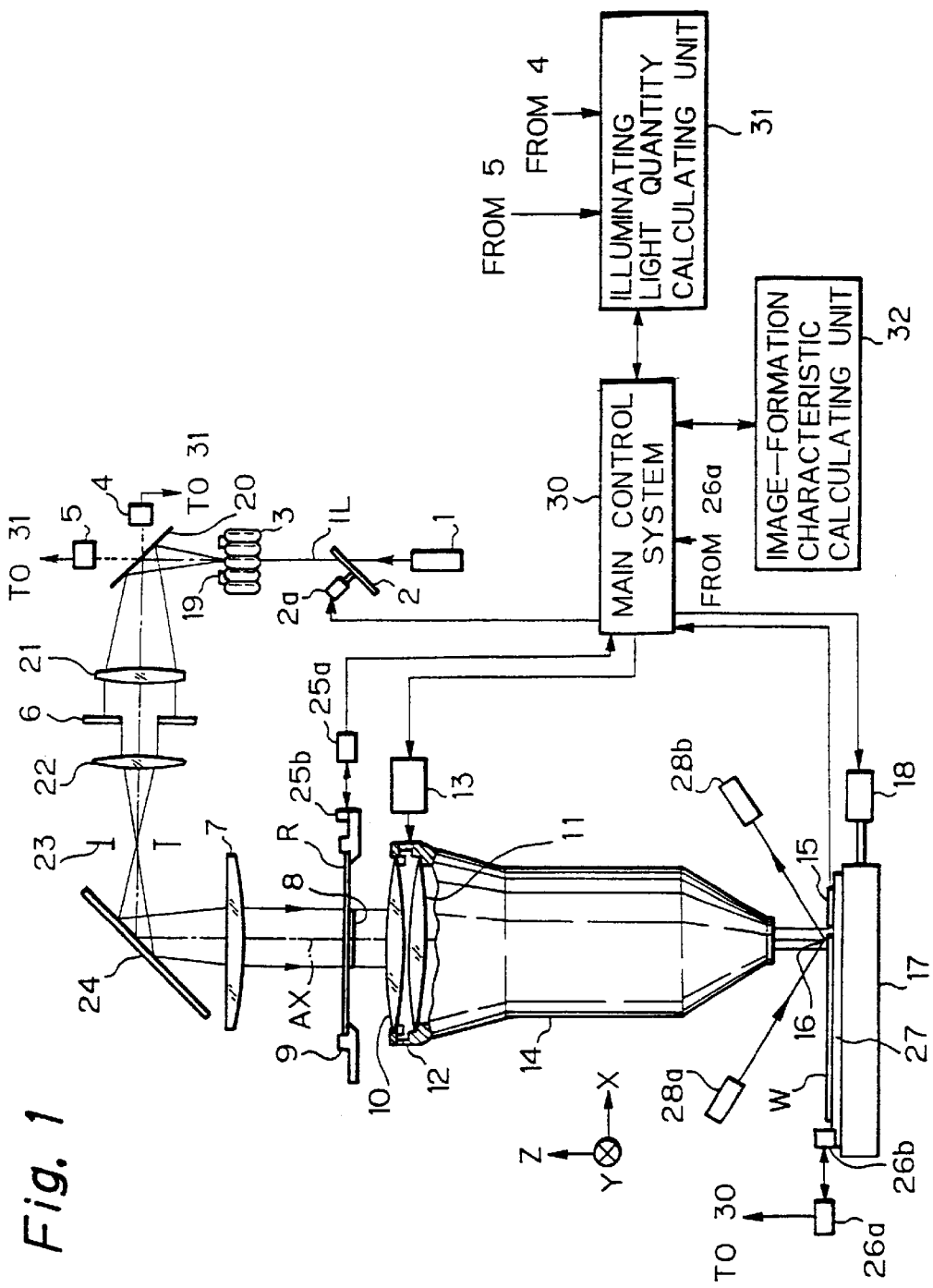
FIG. 1 schematically shows the arrangement of one embodiment of the scanning exposure apparatus according to the present invention.

FIG. 1 schematically shows the arrangement of a projection exposure apparatus according to this embodiment. Referring to FIG. 1, a light source 1 comprises a mercury-vapor lamp. Illuminating light IL from the light source 1 enters a shutter 2. The shutter 2 is controlled by a main control system 30 so as to be selectively opened and closed through a shutter drive system 2a. It should be noted that light source 1 is not necessarily limited to a mercury-vapor lamp. It is also possible to use a harmonic generator such as a YAG laser, or an excimer laser light source such as a KrF excimer laser or an ArF excimer laser. However, when a pulsed light source such as an excimer laser light source is used, the ON/OFF control of illuminating light is effected by the laser light source; no shutter is used.

When the shutter 2 is open, illuminating light IL passes by the shutter 2 and enters a fly's-eye lens 3 through an input lens (not shown). A large number of light source images are formed on an exit surface of the fly's-eye lens 3. Bundles of light rays from these light source images are superimposed on one another, thereby uniformizing the illuminance distribution of illuminating light on a reticle R. An aperture stop 19 is disposed in the vicinity of the exit surface of the fly's-eye lens 3. Illuminating light IL from the light source images passes through the aperture stop 19 and then enters a beam splitter 20 having a high reflectivity and a low transmittance. Illuminating light reflected horizontally by the beam splitter 20 enters a first relay lens 21.

Meanwhile, illuminating light passing through the beam splitter 20 enters a light-receiving surface of an integrator sensor 5, which is a photoelectric sensor. An amount of light proportional to a dose on a wafer W enters the integrator sensor 5. A detection signal (photoelectrically converted signal) from the integrator sensor 5 is transmitted to an illuminating light quantity calculating unit 31. In the illuminating light quantity calculating unit 31, transformation coefficient and other data necessary for obtaining a dose on the wafer W from the detection signal delivered from the integrator sensor 5 have been stored. The illuminating light quantity calculating unit 31 calculates a dose on the wafer W on the basis of the detection signal from the integrator sensor 5, and supplies the result of the calculation to the main control system 30. The apparatus is further provided with a reflection monitor 4, which comprises a photoelectric sensor for monitoring an amount of reflected light from the wafer W (described later). Light reflected from the wafer W and passing through a projection optical system 14, the reticle R and other optical elements is transmitted through the beam splitter 20 to enter the reflection monitor 4. A detection signal from the reflection monitor 4 is transmitted to the illuminating light quantity calculating unit 31 as in the case of the detection signal from the integrator sensor 5. The illuminating light quantity calculating unit 31 calculates an amount of light entering the reflection monitor 4 and a reflectivity of the wafer W on the basis of the detection signal from the reflection monitor 4, obtains an amount of light entering the projection optical system 14 from the result of the calculation, and supplies the result to the main control system 30. The main control system 30 is also connected with an image-formation characteristic calculating unit 32 for calculating a change in the projection magnification of the projection optical system 14 and other image-formation characteristic variations.

On the other hand, illuminating light IL entering the first relay lens 21 passes through a reticle blind 6 to set a field. Thereafter, the illuminating light IL passes through a second relay lens 22 and then passes through an aperture stop 23. Then, the illuminating light IL is bent at approximately right angles by a surface of a dichroic mirror 24 and passes through a condenser lens 7 to illuminate a slit-shaped illumination area 8 with a uniform illuminance distribution, the illumination area 8 being defined on a surface (lower surface) of the reticle R where a pattern has been formed. Illuminating light IL passing through the reticle R passes through the projection optical system 14 to form, on a slit-shaped exposure area 16 on the wafer W, an image of a pattern within the illumination area 8 as an image demagnified at a projection magnification $\beta$ ($\beta$ is 1/4 or 1/5). A Z-axis is taken in a direction parallel to an optical axis AX of the projection optical system 14. An X-axis is taken in a direction parallel to the plane of FIG. 1 in a plane perpendicular to the Z-axis. A Y-axis is taken in a direction perpendicular to the plane of FIG. 1.

The reticle R is held by vacuum on a reticle stage 9. The reticle stage 9 positions the reticle R by slightly moving two-dimensionally in a plane (XY-plane) perpendicular to the optical axis AX of the projection optical system 14. The reticle stage 9 is also movable in the direction X (scanning direction) at a predetermined scanning speed by a reticle drive unit (not shown) which comprises a linear motor, etc. The reticle stage 9 has a travel stroke sufficiently long for the whole surface of the reticle R to cross at least the illuminating light IL. A moving mirror 25b is fixed on an end portion of the reticle stage 9 to reflect a laser beam from a laser interferometer 25a. The position of the reticle stage 9 in the scanning direction is constantly detected by a combination of the laser interferometer 25a and the moving mirror 25b at a resolution of the order of 0.01 $\mu$m, for example. Information concerning the position of the reticle stage 9 from the laser interferometer 25a is transmitted to the main control system 30. The main control system 30 drives the reticle stage 9 through the reticle drive unit (not shown) on the basis of the reticle stage position information. An initial position of the reticle stage 9 is determined so that the reticle R is accurately positioned with respect to a predetermined reference position by a reticle alignment system (not shown), by way of example.

In the projection exposure apparatus according to this embodiment, the reticle R is illuminated by a rectangular (slit-shaped) illumination area 8 having a longitudinal axis in a direction (direction Y) perpendicular to the scanning direction (directionX) of the reticle R. During exposure, the reticle R is scanned in the direction –X (or direction +X) at speed $V_R$. A pattern within the illumination area 8 is projected onto the slit-shaped exposure area 16 on the wafer W through the projection optical system 14.

The wafer W is in inverted image formation relation to the reticle R. Therefore, the wafer W is scanned synchronously with the reticle R at speed $V_W$ in a direction opposite to the scanning direction of the reticle R, that is, in the direction +X (or direction –X). Thus, the pattern on the reticle R is sequentially transferred onto the whole surface of each particular shot area on the wafer W. Where there is neither a distortion nor a magnification error, the scanning speed ratio ($V_W/V_R$) is precisely coincident with the projection magnification $\beta$ of the projection optical system 14. Accordingly, the pattern on the reticle R is accurately transferred in the form of a demagnified image onto shot areas to be exposed on the wafer W successively.

The wafer W is held by vacuum on a wafer holder (not shown). The wafer holder is retained on a Z-stage 27. The Z-stage 27 is arranged to be tiltable in any direction relative to the best focus plane of the projection optical system 14 and also slightly movable in the direction (direction Z) of the optical axis AX by a drive unit provided in the Z-stage 27. The Z-stage 27 is mounted on an XY-stage 17. The XY-stage 17 is arranged to be movable not only in the scanning direction (direction X) but also in a direction (direction Y) perpendicular to the scanning direction so that any of a plurality of shot areas can be moved to an exposure start position as desired. Thus, the XY-stage 17 performs a step-and-scan operation in which are repeated an operation of scan-exposing each shot area on the wafer W and an operation of stepping to an exposure start position for a subsequent shot area. A stage drive unit 18, which includes a motor and other associated elements, drives the XY-stage 17 in the directions X and Y. A moving mirror 26b is fixed on an end portion of the Z-stage 27 to reflect a laser beam from a laser interferometer 26a. The position of the XY-stage 17 in the XY-plane is constantly detected by the laser interferometer 26a at a resolution of the order of 0.01 $\mu$m, for example. Information concerning the position (or speed) of the XY-stage 17 is sent to the main control system 30. The main control system 30 controls the stage drive unit 18 on the basis of the position information (or speed information).

Further, the apparatus shown in FIG. 1 is provided with an oblique incidence type focus position detecting system comprising an illumination optical system 28a which obliquely supplies light for detection toward the surface of the wafer W obliquely to the optical axis AX to form a pinhole image or a slit image, and a light-receiving optical system 28b which re-forms on an oscillating slit a pinhole or slit image from a bundle of reflected rays from the surface of the wafer W and receives a ray bundle passing through the oscillating slit. In the following description, the oblique incidence type focus position detecting system will be referred to as "focus position detecting system (28a and 28b)". The focus position detecting system (28a and 28b) generates a focus signal corresponding to a positional deviation in the direction Z of the surface of the wafer W from the best focus plane of the projection optical system 14, and supplies the focus signal to the main control system 30. The main control system 30 drives the Z-stage 27 in the direction Z on the basis of the focus signal. In this embodiment, the angle of a plane-parallel glass (not shown) provided in the light-receiving optical system 28b has previously been adjusted such that the image-formation plane is a zero standard. Thus, automatic focusing is effected such that the focus signal from the light-receiving optical system 28b is zero. When there is a change in the position of the image-formation plane in the image-formation characteristics of the projection optical system 14, the focus position (i.e. position in the direction Z) of the wafer W is adjusted by slightly changing the angle of the plane-parallel glass, as will be described later.

Further, the apparatus shown in FIG. 1 is provided with a dose monitor 15, which is a photoelectric sensor for detecting an amount of illuminating light passing through the projection optical system 14. The dose monitor 15 has a light-receiving surface sufficiently wide to cover the whole slit-shaped exposure area 16. The dose monitor 15 outputs a detection signal corresponding to an amount of incident light. The detection signal is supplied to the main control system 30. The detection signal is also supplied to the illuminating light quantity calculating unit 31 through the main control system 30. The illuminating light quantity calculating unit 31 calculates an amount of light incident on the wafer W on the basis of the detection signal.

In this embodiment, further, a magnification correction mechanism for correcting the projection magnification of the projection optical system 14 is provided. As shown in FIG. 1, the magnification of the projection optical system 14 is corrected by driving lens elements 10 and 11 through a magnification correction controller 13. In this case, the lens element 11 is secured to the lens barrel body of the projection optical system 14, and the lens element 10 is placed over the lens barrel body with three extendable piezoelectric elements 12 interposed therebetween, thereby making it possible to control the spacing between the lens elements 10 and 11. The piezoelectric elements 12 are arranged to support the lens element 10 in a three-point support fashion, so that the lens element 10 can be tilted relative to a plane perpendicular to the optical axis AX. These operations enable correction of image-formation characteristics of the projection optical system 14, e.g. projection magnification and distortion. It should be noted that electrostrictive elements or magnetostrictive elements may be used in place of the piezoelectric elements 12.

Next, the operation of the projection exposure apparatus according to this embodiment will be described. In this embodiment, a change in the projection magnification (including distortion) of the projection optical system 14 according to the scanning position of the reticle R and a projection magnification change (including distortion) due to thermal expansion of the reticle R are calculated, respectively, and the projection magnification and distortion are corrected by the magnification correction mechanism on the basis of the calculation results.

First, a method of calculating a change in the projection magnification and distortion of the projection optical system 14 will be described. Possible causes of a change in the projection magnification of the projection optical system 14 are an atmospheric pressure change, temperature change, a change in the dose of illuminating light, etc. Regarding atmospheric pressure change and temperature change, changes in the atmospheric pressure and temperature are monitored with an atmospheric pressure sensor and a temperature sensor, and a projection magnification is calculated on the basis of relationships between the atmospheric pressure change and temperature change on the one hand and the magnification change on the other, which have previously been obtained by experiment. In this case, a projection magnification may be calculated on the basis of computational values determined by simulation.

The change of the projection magnification due to a change in the dose of illuminating light slightly varies according to the conditions of the reticle, the illuminance of the light source, etc. First, a relationship between the amount of light entering the projection optical system 14 and the projection magnification has previously been obtained by experiment. Computational values determined by simulation may also be used.

When the temperature distribution in the projection optical system 14 is nonuniform, the distortion may vary according to the position in the exposure area 16 of the projection optical system 14. Therefore, a relationship between the amount of change of the projection magnification and the amount of incident light is calculated at each of a plurality of points in the exposure area 16 of the projection optical system 14. One example of the calculating method will be described with reference to FIG. 2.

Figure 2:
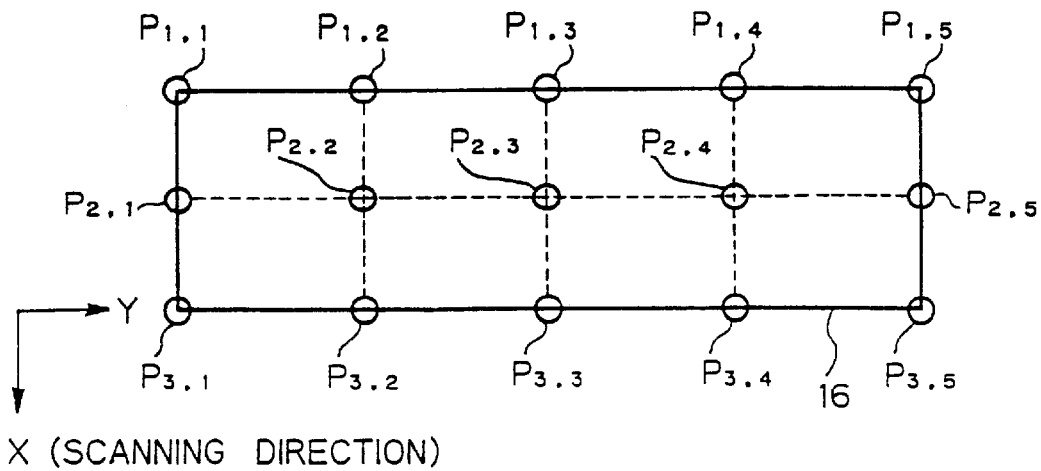
FIG. 2 is a plan view showing the disposition of points for calculation on an exposure area.

FIG. 2 shows the disposition of points in the exposure area 16 for calculating an amount of change of the projection magnification relative to the amount of incident light. In FIG. 2, 15 points $P_{1.1}$ to $P_{3.5}$ are uniformly distributed in the contour and central portions of the slit-shaped exposure area 16, as shown by the circles. In this case, the number and location of the points may be selected by taking into consideration the correction accuracy for the projection magnification.

First, to carry out measurement in the apparatus shown in FIG. 1, a reticle (assumed to be the reticle R) which is used in an actual process is loaded on the reticle stage 9, and a predetermined slit-shaped illumination area is set through the reticle blind 6. Next, the XY-stage 17 is moved to a position where the light-receiving surface of the dose monitor 15 covers the whole slit-shaped exposure area 16. In this state, the shutter 2 is opened, and the reticle stage 9 is scanned to measure an illuminating light quantity at each of a plurality of scanning positions by the dose monitor 15. Because of pattern nonuniformity in the reticle R, the illuminating light quantity changes according to the position in the scanning direction of the reticle R. The changes of the illuminating light quantity in the scanning direction at the plurality of scanning positions are approximated by a least square or other method, and the illuminating light quantity is stored in the form of a function $Q(x)$ of position coordinates x in the scanning direction (direction X) of the reticle. The approximation is performed by the illuminating light quantity calculating unit 31, and the function $Q(x)$ of the illuminating light quantity is stored in a storage part in the illuminating light quantity calculating unit 31.

To carry out actual exposure, the position coordinates of the reticle R are monitored, and an illuminating light quantity at that position of the reticle R is determined on the basis of the function $Q(X)$ of the illuminating light quantity obtained in advance. Because the beam splitter 20 transmits incident light in a predetermined proportion as has been described above, the integrator sensor 5 detects a light quantity that forms a predetermined proportion of the illuminating light IL from the light source 1. Accordingly, when the function $Q(x)$ of the illuminating light quantity is to be obtained, the output of the integrator sensor 5 is measured at the same time as the illuminating light quantity is measured by the dose monitor 15, and a relationship between the illuminating light quantity measured by the dose monitor 15 and the output of the integrator sensor 5 is obtained by the illuminating light quantity calculating unit 31. At the time of exposure, the output of the integrator sensor 5 is constantly monitored without using the dose monitor 15, and a dose on the wafer W, that is, an amount of light passing through the projection optical system 14 from the reticle side, is determined from the output value of the integrator sensor 5 on the basis of the relationship obtained in advance. Thus, even if there is a change in the output of the light source 1 during exposure, the dose on the wafer W can be detected on the basis of the output value from the integrator sensor 5.

When the wafer W on the Z-stage 27 is illuminated, reflected light from the wafer W also enters the projection optical system 14. Therefore, it is necessary to obtain a quantity $Q_L$ of reflected light from the wafer W. The reflected light quantity $Q_L$ is obtained from the product of the quantity $Q(x)$ of light incident on the wafer W and the reflectivity of the wafer W. Accordingly, the reflectivity of the wafer W is needed. To obtain the reflectivity of the wafer W, in advance of actual exposure, a first and second reflecting plates having different reflectivities and also having respective areas larger than the exposure area 16 are successively installed on the Z-stage 27 with the reticle blind 6 placed under the same conditions as in the case of the measurement of the illuminating light quantity (x). The reflecting plates are illuminated by illuminating light through the reticle R while the reticle R is scanned in the direction X, and an output value obtained from the reflection monitor 4 at this time is measured. Output values from the reflection monitor 4 with regard to the two reflecting plates are each stored in the form of a function of the coordinate value x in the scanning direction of the reticle R in the same way as in the case of the measurement of the illuminating light quantity $Q(x)$. Let us assume that the functions obtained with regard to the first and second reflecting plates are first reflection function $f_{R1}(x)$ and a second reflection function $f_{R2}(x)$, respectively. Thus, a relationship between the reflectivity of the wafer and the output value from the reflection monitor 4 during exposure is obtained.

Figure 3:
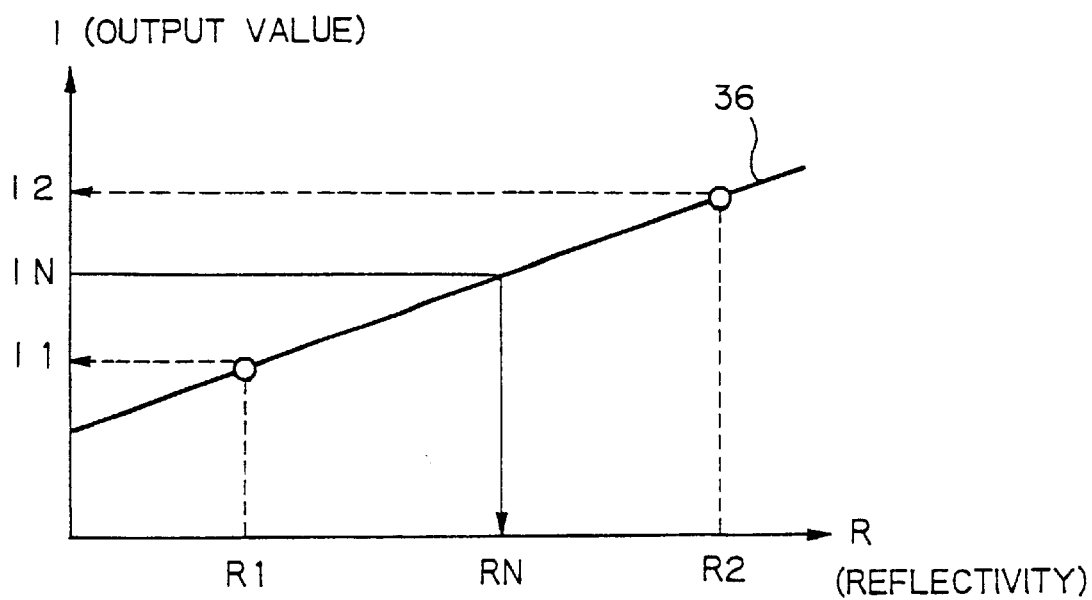
FIG. 3 is a diagram showing the relationship between the reflectivity of a wafer and the output of a reflection monitor.

FIG. 3 is a graph showing the relationship between the reflectivity of the wafer and the output value from the reflection monitor 4. The abscissa axis represents the reflectivity R of the wafer, and the ordinate axis represents the output value I from the reflection monitor 4. In FIG. 3, the relationship between the reflectivity R of the wafer and the output value I from the reflection monitor 4 is represented by a straight line 36 connecting output values I1 and I2 from the reflection monitor 4 at the reflectivities R1 and R2 of the first and second reflecting plates. The straight line 36 is determined by the first reflection function $F_{R1}(x)$ and the second reflection function $f_{R2}(x)$ at the coordinate value x in the scanning direction of the reticle R. Assuming that the output value I from the reflection monitor 4 during exposure is an output value IN, the reflectivity of the wafer at that time is obtained as a reflectivity RN at an intersection on the straight line 36 where the output value I reaches IN. During actual exposure, the illuminating light quantity calculating unit 31 constantly monitors the output from the reflection monitor 4 to thereby calculate a reflectivity of the wafer at each point of time.

The above-described illuminating light quantity $Q(x)$ is an amount of light entering the projection optical system 14 from above it (i.e. from the reticle side), and what is determined by multiplying the illuminating light quantity $Q(x)$ by the reflectivity R of the wafer is an amount of light entering the projection optical system 14 from below it (i.e. from the wafer side). A total sum of the amounts of light entering the projection optical system 14 from above and below it is a total amount of light entering the projection optical system 14. As has been described above, the amounts of light entering the projection optical system 14 from two opposite directions are functions of the coordinate value x in the scanning direction of the reticle R. The total amount of light entering the projection optical system 14 is also obtained by the illuminating light quantity calculating unit 31 in the form of a function of the coordinate value x in the scanning direction of the reticle R.

It should be noted that when the shutter 2 is closed, illuminating light does not enter the projection optical system 14. Therefore, information as to whether the shutter 2 is open or closed is monitored, and when the shutter 2 is open, the above-described amount of incident light is used.

In this case, when the shutter 2 is closed, the output from the integrator sensor 5 is zero. Because the integrator sensor 5 is in a monitoring state at all times, the output from the integrator sensor 5 may be constantly monitored instead of monitoring information as to whether the shutter 2 is open or closed.

By the above-described method, an amount of light entering the projection optical system 14 during actual exposure is obtained approximately in real time. The amount of incident light thus obtained is transmitted to the image-formation characteristic calculating unit 32 through the main control system 30. The image-formation characteristic calculating unit 32 calculates a change in the projection magnification of the projection optical system 14 (i.e. an amount of lateral displacement of the image) at each of the points $P_{1,1}$ to $P_{3,5}$ in the exposure area 16, shown in FIG. 2, by using the relationship between the amount of light entering the projection optical system 14 and the projection magnification, which has previously been obtained, taking into consideration the nonuniformity of the temperature distribution in the projection optical system 14. If an amount of change of the projection magnification due to an atmospheric pressure change and a temperature change is added to the calculated change in the projection magnification, an amount of change in the projection magnification of the projection optical system 14, together with a distortion, during exposure can be calculated.

The following is a description of a method of calculating an amount of change in the projection magnification and distortion of a projected image in a case where the reticle R may thermally expand by absorption of illuminating light. In this embodiment, a relationship between the amount of light absorbed by the reticle R and the amount of change in the projection magnification of the projected image due to expansion of the reticle R is obtained by experiment and calculation and stored in the main control system 30.

The expansion of the reticle is not uniform, but the degree of expansion varies according to the position on the reticle in accordance with the amount of light absorbed. The degree of expansion is approximately proportional to the temperature distribution. Therefore, amounts of thermal expansion of the reticle are obtained at a plurality of points on the reticle. One example of a method of calculating an amount of thermal expansion of the reticle will be described below with reference to FIG. 5.

Figure 5:
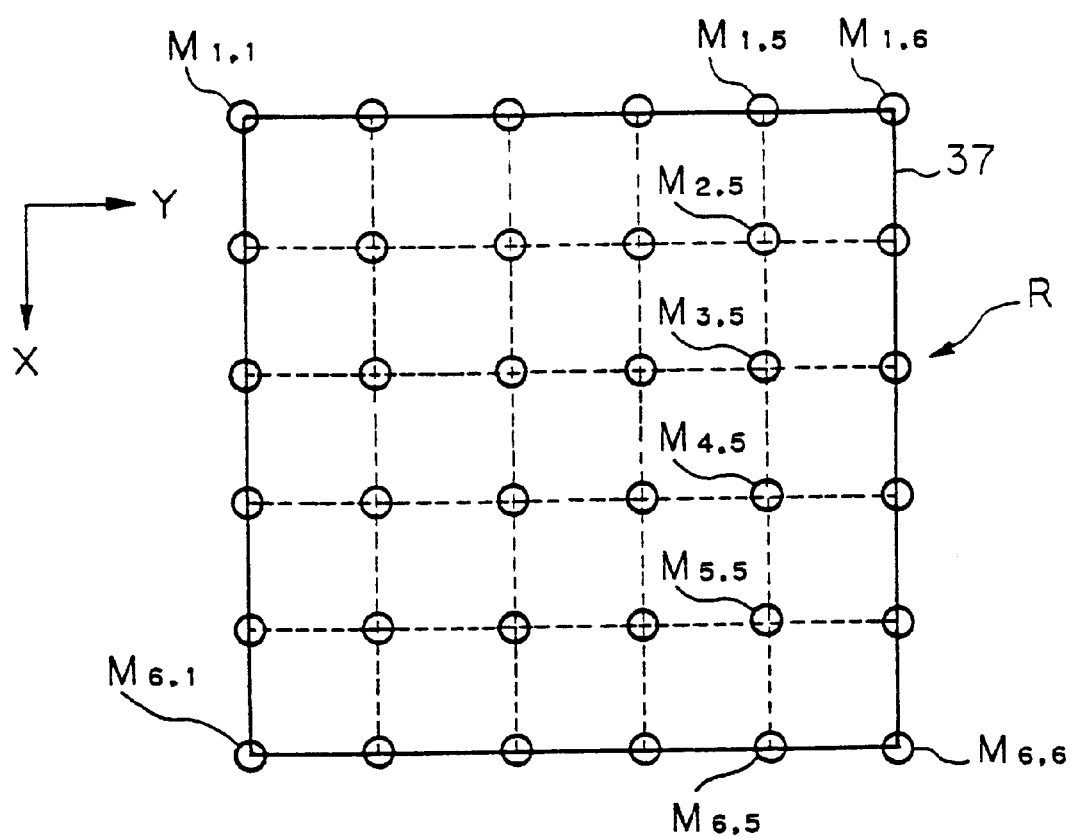
FIG. 5 is a plan view showing the disposition of points for expansion calculation on a reticle.

FIG. 5 shows the disposition of points for calculating an amount of thermal expansion of the reticle R. In FIG. 5, an ideal lattice 37 is set over almost the whole surface of the pattern area on the reticle R, and points $M_{1,1}$ to $M_{6,6}$ are set at 36 intersections of the ideal lattice 37 as shown by the circles. In this case, the number and location of points for calculation may be selected by taking into consideration the correction accuracy for the projection magnification.

Next, an amount of light incident on the reticle R is obtained. For this purpose, a relationship between the amount of light incident on the reticle R and the output value from the integrator sensor 5 is obtained in advance by experiment. Computational values may be used in place of experimental values. It is also possible to obtain a relationship between the output value from the dose monitor 15 and the amount of light incident on the reticle R by experiment or calculation and to obtain an amount of light incident on the reticle R from an output value from the dose monitor 15. If a relationship between the output value from the dose monitor 15 and the output value from the integrator sensor 5 has previously been obtained as described above, it is possible, at the time of actual exposure, for the illuminating light quantity calculating unit 31 to calculate an amount of light incident on the reticle R by monitoring the integrator sensor 5. Let us assume the amount of light incident on the reticle R to be $Q_R$.

Next, heat absorptance of the reticle R is obtained. Usually, a reticle is made of quartz, and a pattern is written thereon by using chromium. The greater part of heat incident on the reticle R is absorbed by the chromium pattern layer. Because the reflectivity of chromium with respect to light of a predetermined wavelength is known, it is possible to preset the heat absorptance of each particular reticle. Let us assume the heat absorptance of the reticle R to be. h.

Next, a pattern presence ratio p in the scanning direction of the reticle R is obtained. Usually, a reticle pattern is nonuniform, and an area illuminated by illuminating light shifts as the reticle is scanned. Therefore, a pattern presence ratio is obtained according to the position coordinate in the scanning direction of the reticle R. First, the light-receiving surface of the dose monitor 15 is set so as to cover the exposure area 16, shown in FIG. 1. Thereafter, the reticle stage 9 is scanned with no reticle placed thereon to obtain and store an output value from the dose monitor 15 at each position coordinate in the scanning direction. Next, the reticle stage 9 is scanned with a reticle R for actual use placed thereon, thereby similarly obtaining and storing an output value from the dose monitor 15 at each position coordinate in the scanning direction.

The ratio of the output value obtained from the dose monitor 15 with the reticle R placed to the output value obtained from the dose monitor 15 with no reticle R placed is the transmittance of the reticle R. Therefore, the transmittance is subtracted from 1 to thereby obtain a pattern presence ratio p according to the position x in the scanning direction.

It should be noted that because information concerning the pattern on the reticle R can be input in advance, pattern presence ratios p at a plurality of positions on the reticle R may be stored in advance.

The image-formation characteristic calculating unit 32 obtains an amount of light absorbed by the reticle R as a function of the position x in the scanning direction of the reticle R from the product $(Q_R \cdot h \cdot p)$ of the amount $Q_R$ of light incident on the reticle R, the heat absorptance h of the reticle R, and the pattern presence ratio p according to the position x in the scanning direction of the reticle R, which are obtained by the foregoing methods.

It should be noted that a change in the amount of light incident on the reticle R according to whether the shutter 2 is open or closed is similar to that in the case of the above-described detection of an amount of light entering the projection optical system 14. Accordingly, an amount of light absorbed at each coordinate position on the reticle R can be calculated in real time. Thus, the image-formation characteristic calculating unit 32 calculates an amount of thermal expansion at each of the points $M_{1.1}$ to $M_{6.6}$, shown in FIG. 5, from the amount of light absorbed, obtained as described above. The amount of thermal expansion thus calculated directly appears as a change in the projection magnification on the wafer. Thus, a change in the projection magnification of the projected image, together with a distortion, due to heat absorption by the reticle during exposure can be calculated in the form of a function of the position x in the scanning direction of the reticle R.

Next, a method of correcting the projection magnification and distortion of the projected image on the wafer will be described.

The change in the projection magnification due to the absorption of illuminating light by the projection optical system and the change in the projection magnification due to the absorption of heat by the reticle, which are obtained by the foregoing methods, are corrected by the above-described magnification correction mechanism using piezoelectric elements. It is assumed that a relationship between the amount of change in the projection magnification or the distortion and the amount of vertical movement or angle of tilt of the lens element 10 caused by driving the piezoelectric elements 12, shown in FIG. 1, has previously been obtained by experiment and stored in the magnification correction controller 13. It should be noted that the relationship between the amount of vertical movement or tilt angle of the lens element 10 and the amount of change in the projection magnification or the distortion may also be obtained by optical simulation. On the basis of the stored relationship, the distortion and the projection magnification are corrected at the time of exposure such that a nondistorted image is projected at a predetermined magnification. It should be noted that during the correction a focus change of the best focus plane (i.e. a change of the focus position) is also secondarily caused by the vertical movement of the lens element 10. Therefore, the focus signal from the focus position detecting system (28a and 28b), shown in FIG. 1, is shifted correspondingly to the amount of focus change. Thus, the in-focus condition is maintained at all times.

First, an operation of correcting a distortion and a change of the projection magnification due to light entering the projection optical system 14 will be described.

Figure 4A:
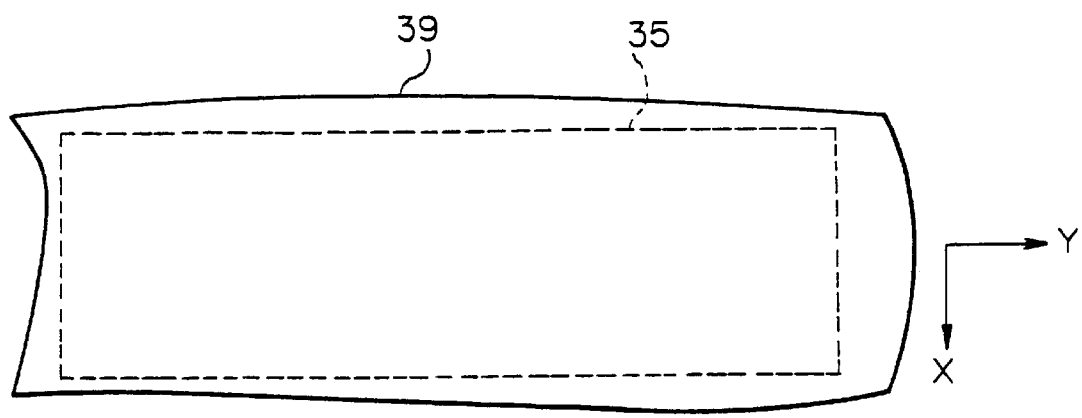
FIGS. 4(a), 4(b) and 4(c) illustrate a method of correcting a distortion change by a projection optical system shown in FIG. 1.
Figure 4B:
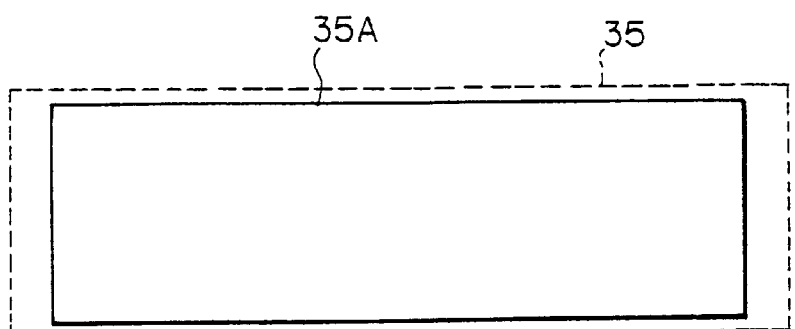
Figure 4C:
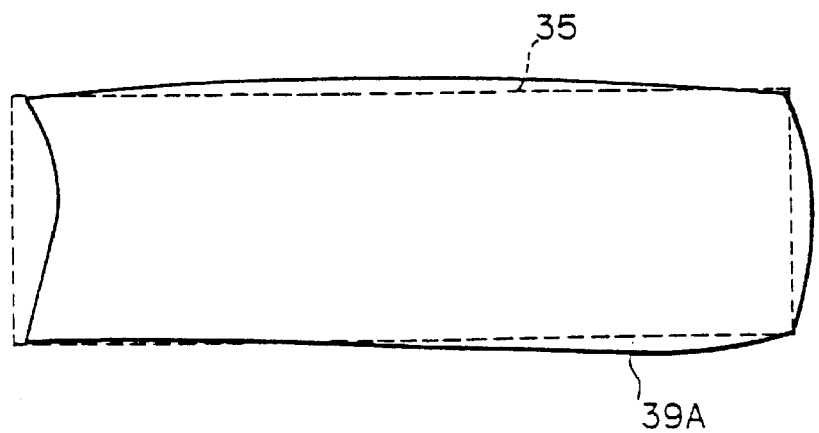

FIGS. 4(*a*), 4(*b*) and 4(*c*) illustrate a method of correcting a distortion and projection magnification change in the projection optical system 14. FIG. 4(*a*) shows a distortion due to lateral displacement of a projected image calculated at the number of points which is larger than 15 as in FIG. 2. In the figure, an ideal projected image 35 is formed as a distorted projected image 39. In this example, there are uniform increases of the projection magnification in both the scanning direction (direction X) and the non-scanning direction (direction Y). FIG. 4(*a*) shows where the reticle R is at a certain scanning position. As the scanning position of the reticle R changes, the amount of incident light changes owing to the change in the pattern presence ratio, and the condition of distortion also changes.

Therefore, the position of the lens element 10 in the magnification correction mechanism, shown in FIG. 1, is changed such that the distortion shown in FIG. 4(*a*) is canceled. In this case, as shown in FIG. 4(*b*), the projection magnification is corrected such that the ideal projected image 35 becomes a demagnified projected image 35A. As a result, as shown in FIG. 4(*c*), the distortion of a projected image 39A, which is obtained after the projection magnification correction, relative to the ideal projected image 35 is smaller than in the case of the projected image 39 shown in FIG. 4(*a*).

Next, an operation of correcting a distortion and magnification change of a projected image due to absorption of heat by the reticle R will be described.

Figure 6:
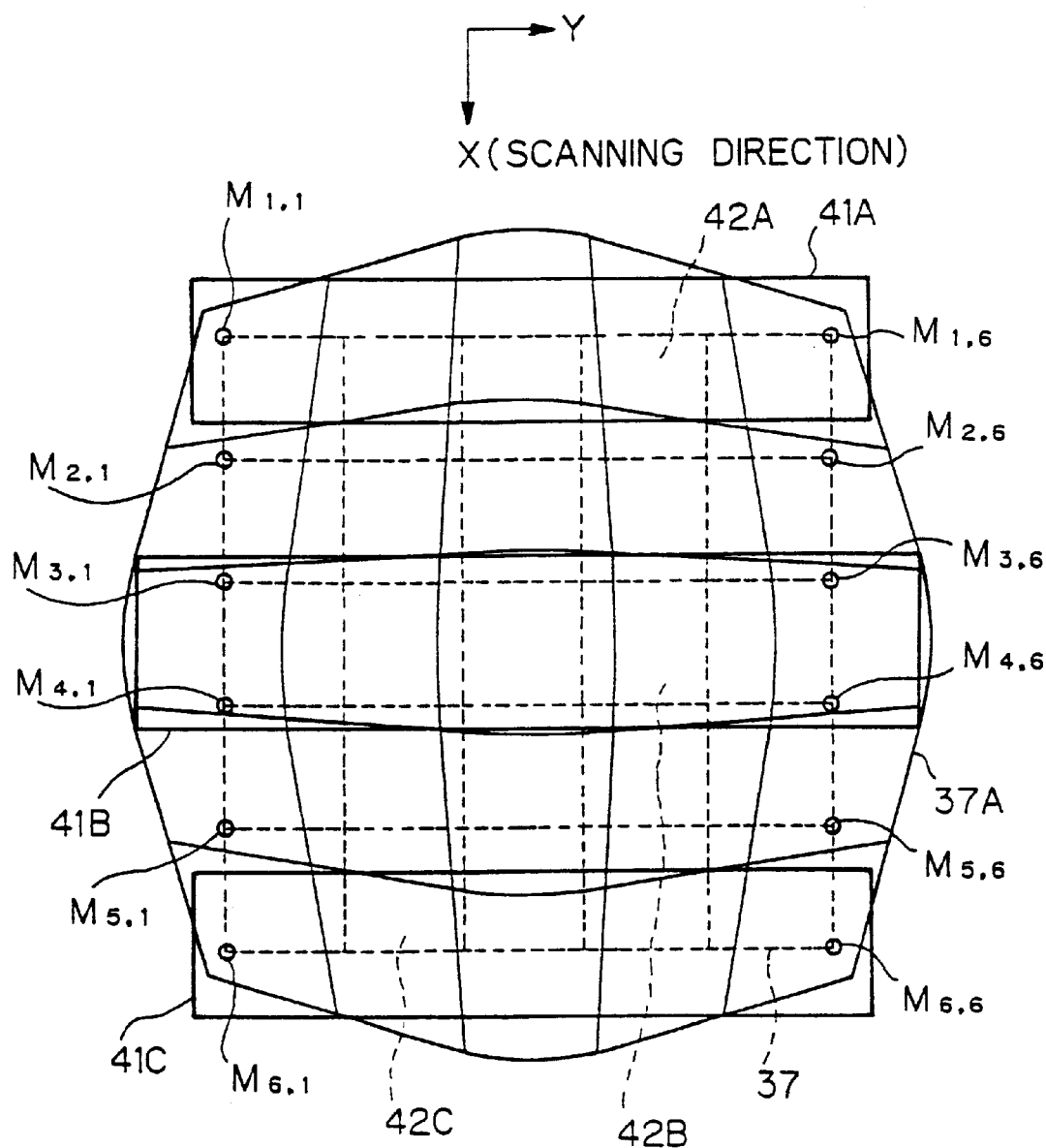
FIG. 6 shows one example of deformation of a reticle in FIG. 1 by thermal expansion.

FIG. 6 illustrates a method of correcting a distortion and magnification change due to absorption of heat by the reticle R. FIG. 6 shows a pattern obtained by interpolating amounts of thermal expansion at the 36 points in FIG. 5. In FIG. 6, the ideal lattice 37 set on the reticle R as shown by the dotted lines is expanded to a barrel-shaped pattern 37A due to light incident on the reticle R.

As has been described above, the expansion of the reticle R causes the distortion and magnification of the projected image to change. For example, a region 42A on the ideal lattice 37 which is surrounded by the points $M_{1,1}$, $M_{1,6}$, $M_{2,1}$ and $M_{2,6}$ is caused by thermal expansion to become approximately a region 41A (shown by the continuous lines) which is slightly larger than the region 42A in the non-scanning direction and also somewhat larger than the region 42A in the scanning direction, provided that the distortion is ignored. In contrast, a region 42B surrounded by the points $M_{3,1}$, $M_{3,6}$, $M_{4,1}$ and $M_{4,6}$ is caused by thermal expansion to become approximately a region 41B (shown by the continuous lines) which is larger than the region 42B in the non-scanning direction and also somewhat larger than the region 42B in the scanning direction, provided that the distortion is ignored. Similarly, a region 42C surrounded by the points $M_{5,1}$, $M_{5,6}$, $M_{6,1}$ and $M_{6,6}$ is caused by thermal expansion to become approximately a region 41C (shown by the continuous lines) which is slightly larger than the region 42C in the non-scanning direction and also somewhat larger than the region 42C in the scanning direction, provided that the distortion is ignored. Moreover, because the enlargement of the pattern on the reticle caused by thermal expansion results directly in an enlargement of the projected image, the amount of change in the projection magnification of the projected image varies according to the position x in the scanning direction of the reticle R. The change in the projection magnification is particularly large in the central portion in the scanning direction.

The position of the lens element 10 is adjusted by driving the piezoelectric elements 12 through the magnification correction controller 13 such that the above-described change in the projection magnification is canceled. During actual exposure, the above-described projection magnification continuously changes in the scanning direction. Therefore, the position of the lens element 10 is continuously adjusted in association with the movement of the reticle R in the scanning direction. As will be understood from FIG. 6, the thermal expansion of the reticle also causes a distortion. Accordingly, the distortion may be suppressed by controlling the tilt angle of the lens element 10, by way of example.

Although in the foregoing description, the correction of the projection magnification and distortion for changes caused by the projection optical system 14 and the correction for such changes caused by the reticle R are carried out separately, it should be noted that in actual practice, correction is made so as to simultaneously cancel a projection magnification change and distortion which are composed of a projection magnification change and distortion caused by the projection optical system 14 and those due to expansion of the reticle R. By doing so, a predetermined projection magnification can be maintained at all times.

When a reticle expands as shown in FIG. 6, there is a positional displacement of the reticle in the scanning direction. The positional displacement in this case is corrected by changing the relative velocity between the reticle R and the wafer W through feedback control of the scanning speed of the reticle R.

Thus, the scanning exposure apparatus according to this embodiment is arranged such that a change of a projected image due to thermal expansion of a reticle is obtained according to the position coordinate in the scanning direction of the reticle. Therefore, it becomes possible to correct a deformation of the projected image caused by thermal expansion of the reticle by controlling the projection magnification according to the scanning position of the reticle. Accordingly, the projection magnification of the projected image can be corrected with high accuracy over the whole surface of each shot area on the wafer. Moreover, a distortion is also corrected with only a magnification correction mechanism by obtaining an average magnification change. Therefore, it is not necessary to equip the apparatus with a complicated distortion correction mechanism.

It should be noted that as a magnification correction mechanism it is possible to use not only a mechanism in which the lens element 10 is driven as in the foregoing embodiment but also a correction mechanism wherein the pressure in a predetermined gas chamber provided in the projection optical system is changed to adjust the refractive index of the gas contained therein, or a correction mechanism wherein the reticle is moved parallel in the optical axis direction of illuminating light or tilted relative to the optical axis.

Thus, the present invention is not necessarily limited to the above-described embodiment but may adopt various arrangements without departing from the gist of the present invention.

In the scanning exposure apparatus according to the present invention, an amount of change of a mask, for example, is obtained according to the position in the scanning direction of the mask, and the magnification is corrected on the basis of the obtained amount of change. Therefore, even when the mask has been deformed by thermal expansion, for example, it is possible to make magnification correction corresponding to the deformation. Accordingly, the magnification can be corrected with high accuracy irrespective of the position in the scanning direction of the mask. Thus, excellent image-formation characteristics can be obtained.

It is also possible to correct a distortion change, for example, by the projection magnification correction mechanism. In this case, there is no need of equipping the apparatus with a complicated distortion correction mechanism. Accordingly, the cost of the apparatus can be reduced.

In a case where the apparatus has a device for calculating an amount of change in the projection magnification, at which a mask pattern is projected onto a photosensitive substrate, according to the scanning position of the mask, and the correction mechanism corrects the projection magnification on the basis of the amount of change in the projection magnification calculated by the calculating device, an amount of change in the projection magnification is calculated by the calculating device, and the projection magnification is corrected on the basis of the calculated amount of change.

In a case where the calculating device calculates an amount of change in the magnification of the projected image according to the position of the mask and also calculates an amount of change in the magnification of the projection optical system to obtain an overall amount of magnification change on the basis of the two calculations of amounts of magnification change, it is possible to obtain both an amount of change in the magnification of the projected image according to the scanning position of the mask and an amount of change in the magnification of the projection optical system, and magnification correction is effected on the basis of the obtained amounts of magnification change through the correction mechanism. Accordingly, the calculation of an overall amount of magnification change is favorably simplified.

What is claimed is:
1. A scanning exposure method comprising:
synchronously scanning a mask and a work-piece relative to illuminating light to transfer a pattern of said mask onto said work-piece through a projection optical system by scanning exposure; and changing, during said scanning exposure, an imaging characteristic of said projection optical system according to a scanning position of said mask to correct a change in imaging condition of a pattern image projected by said projection optical system due to thermal transformation of said mask.

2. A scanning exposure method according to claim 1, wherein said imaging characteristic of said projection optical system includes at least one of magnification and distortion.

3. A scanning exposure method according to claim 1, wherein the change of said imaging characteristic is effected by moving a lens element of said projection optical system.

4. A scanning exposure method according to claim 1, wherein the change of said imaging characteristic is effected by adjusting a refractive index in an enclosed space provided in said projection optical system.

5. A scanning exposure method according to claim 1, further comprising the step of obtaining amounts of thermal transformation at a plurality of positions on said mask on the basis of an amount of light incident on said mask, wherein the imaging characteristic of said projection optical system is changed on the basis of said amounts of thermal transformation obtained.

6. A scanning exposure method according to claim 5, wherein the amounts of thermal transformation at a plurality of positions on said mask are obtained on the basis of a pattern density on said mask.

7. A scanning exposure method according to claim 1, further comprising the step of obtaining an amount of change in imaging condition of said pattern image due to thermal transformation of said mask in correspondence to each scanning position on said mask.

8. A scanning exposure method according to claim 1, further comprising the step of obtaining an amount of change in the imaging characteristic of said projection optical system on the basis of an amount of light entering said projection optical system, wherein said projection optical system is adjusted by taking into consideration said obtained amount of change in the imaging characteristic of said projection optical system.

9. A scanning exposure method comprising:

synchronously scanning a mask and a work-piece relative to an energy beam to transfer a pattern of said mask onto said work-piece by scanning exposure; and correcting, according to a relative scanning position between said mask and said energy beam during said scanning exposure, a change in imaging condition of a pattern image due to thermal transformation of said mask.

10. A scanning exposure method according to claim 9, wherein the correction of said change in the imaging condition is effected by adjusting a position of said mask in a direction of an axis of said energy beam or a tilt of said mask relative to said axis.

11. A scanning exposure method according to claim 9, wherein the correction of said change in the imaging condition is effected by adjusting a projection system which projects the pattern image onto the work-piece.

12. A scanning exposure method according to claim 11, wherein the adjustment of said projection system is effected by moving a part of elements of the projection system.

13. A scanning exposure method according to claim 9, wherein the imaging condition includes at least one of magnification and distortion of the image.

14. A scanning exposure method according to claim 9, further comprising:

obtaining an amount of change in imaging condition of said pattern image due to thermal transformation of said mask in correspondence to the relative scanning position between said mask and said energy beam.

15. A scanning exposure method according to claim 9, wherein said energy beam includes an excimer laser beam.

16. A scanning exposure method in which a pattern of a mask is transferred onto a work-piece while scanning said mask relative to an energy beam, the method comprising:

obtaining information on thermal transformation of said mask relating to each scanning position of said mask during scanning exposure, wherein amounts of thermal transformation of said mask in an illumination area of said energy beam change during the scanning exposure; and controlling scanning exposure operation based on the obtained information.

17. A scanning exposure method according to claim 16, wherein the control of the scanning exposure operation is effected by changing an imaging condition of a pattern image projected on the work-piece during the scanning exposure.

18. A scanning exposure method according to claim 17, wherein the change in the imaging condition of the pattern image includes an adjustment of magnification of the projected pattern image.

19. A scanning exposure method according to claim 17, wherein the change in the imaging condition of the pattern image includes an adjustment of distortion of the projected pattern image.

20. A scanning exposure method according to claim 16, wherein the control of the scanning exposure operation is effected by moving said mask during the scanning exposure.

21. A scanning exposure method according to claim 16, wherein the control of the scanning exposure operation is effected by adjusting a projection system which projects a pattern image onto the work-piece.

22. A scanning exposure method according to claim 21, wherein the adjustment of said projection system is effected by moving a part of elements of the projection system.

23. A scanning exposure method according to claim 21, wherein the adjustment of said projection system is effected by adjusting a refractive index in an enclosed space provided in said projection system.

24. A scanning exposure method according to claim 16, wherein said information on thermal transformation of the mask is obtained on the basis of amounts of energy which enters said mask.

25. A scanning exposure method according to claim 16, wherein said information on thermal transformation of the mask is obtained on the basis of a pattern density on said mask.

26. A scanning exposure method according to claim 16, wherein the control of the scanning exposure operation is effected by changing a relative velocity between said mask and said work-piece.

27. A device manufacturing method including a scanning exposure method according to claim 16.

28. A scanning exposure method according to claim 1, wherein amounts of thermal transformation of said mask differ from one position on said mask to another position, the positions being apart from each other in a scanning direction of the mask.

29. A device manufacturing method including a scanning exposure method according to claim 1.

30. A scanning exposure method according to claim 9, wherein amounts of thermal transformation of said mask differ from one position on said mask to another position, the positions being apart from each other in a scanning direction of the mask.

31. A device manufacturing method including a scanning exposure method according to claim 9.

32. A scanning exposure method comprising:

synchronously scanning a mask and a work-piece relative to an energy beam to expose the work-piece by scanning exposure; and controlling the scanning exposure based on information about thermal transformation of said mask, wherein amounts of thermal transformation of said mask differ from one position on said mask to another position, and wherein the positions are apart from each other in a scanning direction of the mask.

33. A scanning exposure method according to claim 32, wherein the control of the exposure operation includes a change in an imaging condition of a pattern image projected onto the work-piece during the scanning exposure.

34. A scanning exposure method according to claim 32, wherein the control of the exposure operation includes a movement of said mask during the scanning exposure.

35. A scanning exposure method according to claim 32, wherein the control of the exposure operation includes an adjustment of a projection system which projects a pattern image onto the work-piece.

36. A scanning exposure method according to claim 32, wherein said thermal information is obtained on the basis of amounts of energy which enter said mask.

37. A scanning exposure method according to claim 32, wherein said thermal information is obtained on the basis of a pattern density on said mask.

38. A scanning exposure method according to claim 32, wherein the control of the scanning exposure includes an adjustment of a relative velocity between said mask and said work-piece.

39. A device manufacturing method including a scanning exposure method according to claim 32.

* * * * *